(12) United States Patent
Koller et al.

(10) Patent No.: US 10,043,701 B2
(45) Date of Patent: Aug. 7, 2018

(54) SUBSTRATE REMOVAL FROM A CARRIER

(71) Applicant: Infineon Technologies AG, Neubiberg (DE)

(72) Inventors: Adolf Koller, Rogensburg (DE); Franco Mariani, Regensburg (DE); Katharina Umminger, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 1140 days.

(21) Appl. No.: 13/895,241

(22) Filed: May 15, 2013

(65) Prior Publication Data

US 2014/0338827 A1    Nov. 20, 2014

(51) Int. Cl.
*H01L 21/00* (2006.01)
*H01L 21/683* (2006.01)
*H01L 21/67* (2006.01)

(52) U.S. Cl.
CPC .... *H01L 21/6836* (2013.01); *H01L 21/67115* (2013.01); *H01L 21/67132* (2013.01); *H01L 2221/68327* (2013.01); *H01L 2221/68381* (2013.01); *Y10T 156/1917* (2015.01); *Y10T 156/1994* (2015.01)

(58) Field of Classification Search
CPC ............... H01L 21/78; H01L 21/6836; H01L 2221/68327; H01L 21/6835; H01L 2221/6834; H01L 21/00; H01L 21/60; H01L 21/68; H01L 21/68; H01L 21/683; H01L 21/683; H01L 21/67; H01L 21/67; H01L 21/671; H01L 21/671; H01L 21/6711; H01L 21/6711; H01L 21/67115; H01L 21/6713; H01L 21/6713; H01L 21/67132; H01L 21/70; H01L 2221/00; H01L 2221/60; H01L 2221/68; H01L 2221/68; H01L 2221/683; H01L 2221/683; H01L 2221/6832; H01L 2221/6832; H01L 21/6834; Y10T 156/1994; Y10T 156/00; Y10T 156/10; Y10T 156/19; Y10T 156/19; Y10T 156/199; Y10T 156/199
USPC ..... 156/247, 767; 438/113, 107, 114, 33, 68
See application file for complete search history.

(56) References Cited

U.S. PATENT DOCUMENTS

| | | | |
|---|---|---|---|
| 6,297,131 B1* | 10/2001 | Yamada | H01L 21/6835 257/E21.599 |
| 7,125,948 B2 | 10/2006 | Kozakai et al. | |
| 7,863,104 B2* | 1/2011 | Kroeninger | H01L 21/6835 438/113 |
| 8,535,983 B2 | 9/2013 | Hin et al. | |
| 2007/0143992 A1 | 6/2007 | Kyouzuka | |
| 2009/0098684 A1* | 4/2009 | Kroeninger | H01L 21/6835 438/114 |

(Continued)

FOREIGN PATENT DOCUMENTS

CN    1993021 A    7/2007
CN    102810490 A    12/2012

(Continued)

*Primary Examiner* — Michael N Orlando
*Assistant Examiner* — Matthew Hoover
(74) *Attorney, Agent, or Firm* — Slater Matsil, LLP

(57) ABSTRACT

Methods and apparatuses are provided where a parting agent is applied to at least one portion of a substrate. The at least one portion of the substrate is removed from a carrier.

14 Claims, 2 Drawing Sheets

(56) References Cited

U.S. PATENT DOCUMENTS

2012/0309130 A1* 12/2012 Hin ............... H01L 23/3114
                                                    438/113
2013/0178585 A1* 7/2013 Lee ............... H01L 21/6836
                                                    525/28

FOREIGN PATENT DOCUMENTS

EP     0 129 915 B1   10/1987
WO     2012087780 A2   6/2012

* cited by examiner

SUBSTRATE REMOVAL FROM A CARRIER

TECHNICAL FIELD

The present application relates to methods and apparatuses related to removal of a portion of a substrate from a carrier.

BACKGROUND

In the semiconductor industry, for various kinds of processing, substrates, for example, semiconductor wafers, are mounted to a carrier for processing. For example, for grinding or other processes where the substrate is thinned, the substrate may be mounted to a so-called grinding tape. The substrate may then be transferred from the grinding tape to a so-called dicing tape. The substrate adheres to such tapes usually due to some kind of adhesive being provided on at least one side of the tape.

In some situations, it may be desirable to remove a portion of the substrate from the respective tape again, without influencing the adhesion of the remaining substrate. For example, in the above-mentioned situation, when the substrate is mounted to a dicing tape, the substrate being diced, i.e., cut to several pieces, some portions, for example, a peripheral portion of the substrate, may have to be removed, which may turn out to be difficult in some circumstances.

DETAILED DESCRIPTION OF ILLUSTRATIVE EMBODIMENTS

In the following, various embodiments will be discussed in detail with reference to the attached drawings. It is to be noted that these embodiments serve as examples only and are not to be construed as limiting the scope of the present application. For example, features of different embodiments may be combined to form new embodiments. On the other hand, while embodiments are being described as comprising a plurality of features or elements, it should be noted that this is not to be construed as indicating that all those features or elements are necessary for implementation of embodiments. In contrast, other embodiments may comprise less features, alternative features and/or additional features compared to the described embodiments.

Various embodiments relate to the removal of one or more portions of a substrate from a carrier. To facilitate such a removal, in some embodiments, a parting agent is applied to one or more portions of the substrate to be removed from the carrier later, for example, prior to mounting the substrate to the carrier.

While embodiments in the following will be described using semiconductor wafers like silicone wafers as examples for substrates, techniques, devices and methods disclosed herein may also be applied to other substrates, for example, glass substrates. Furthermore, while tapes are used as example for carriers, other kinds of carriers may also be used, for example, glass carriers, metal carriers or plastic carriers, which may be coated with an adhesive on at least one side thereof.

Figure 1:
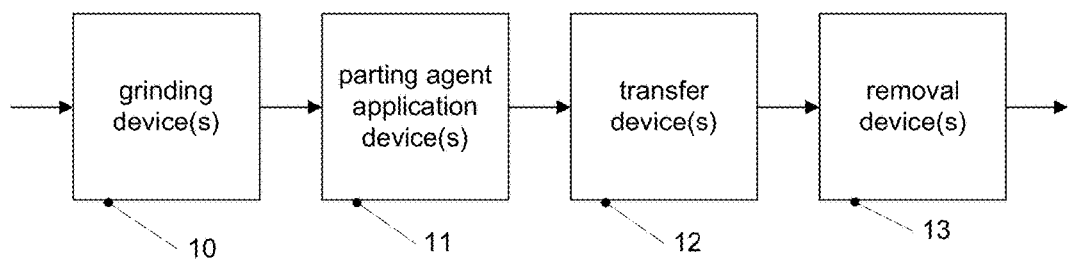
FIG. 1 is a block diagram of an apparatus according to an embodiment.

Turning now to the figures, in FIG. 1 an apparatus usable for processing of substrates according to an embodiment is shown. The apparatus of FIG. 1 is shown as comprising a plurality of different devices 10, 11, 12 and 13. While these devices are shown as separate blocks, two or more of the devices shown may also be integrated within a single device, such that the single device performs the corresponding functions. On the other hand, various devices may also be located remote from each other, for example, even in different rooms or different buildings, substrates being transported between the devices. Furthermore, other embodiments may comprise only some of the devices shown in FIG. 1, may comprise additional devices and/or may comprise alternative devices. It should also be noted that additional devices to perform other acts during a substrate processing may be provided between devices 10-13 depicted in FIG. 1.

In the apparatus of FIG. 1, one or more grinding device(s) 10 (in the following simply referred to as grinding device 10) are provided. In grinding device 10, a substrate may be thinned. It is to be noted that grinding device 10 is merely one example of a device usable for substrate processing prior to application of a parting agent (see below), and in other embodiments other kinds of processing, for example, etching, may additionally or alternatively occur. Also, as indicated by an arrow in FIG. 1, substrates may be supplied to grinding device 10. These substrates may be unprocessed substrates or substrates which have undergone previous processing. In some embodiments, the substrates may be semiconductor wafers, for example, silicon wafers. In some embodiments, semiconductor devices may be formed on the substrate.

In still other embodiments, grinding device 10 may be omitted, and processed or unprocessed substrates may be directly supplied to one or more parting agent application device(s) 11 (in the following simply referred to as parting agent application device 11). Parting agent application device 11 applies a parting agent, i.e., a substance facilitating a layer separation, to one or more portions of the substrate. For example, a parting agent based on fluorosilicone or a fluoropolymer may be used. In some embodiments, the parting agent may be a radiation-sensitive material, for example, sensitive to ultraviolet radiation.

To apply the parting agent to desired portions of the substrates, conventional techniques may be used. For example, the parting agent may be applied to the desired portions using a nozzle. Alternatively, a photoresist may be applied to the substrate and then removed from the substrate at the desired portions, and following this the parting agent may be applied to the complete substrate, for example, by spinning. When the remaining photoresist is dissolved, the parting agent is removed from portions apart from the desired portions. Other techniques may also be employed.

After the parting agent has been applied by parting agent application device 11, one or more transfer device(s) 12 (in the following simply referred to as transfer device 12) transfer the substrate to a carrier, for example, an adhesive tape. After the transfer, one or more removal device(s) (in the following referred to as removal device 13) serve to remove one or more portions of the substrate to which the parting agent previously has been applied from the carrier. To this end, removal device 13 may for example comprise an ultraviolet light source in case the parting agent is sensitive to ultraviolet light.

After the portions of the substrate have been removed by removal device 13, as indicated by an arrow the remaining substrates may be further processed or treated, for example, shipped to a customer.

Figure 2:
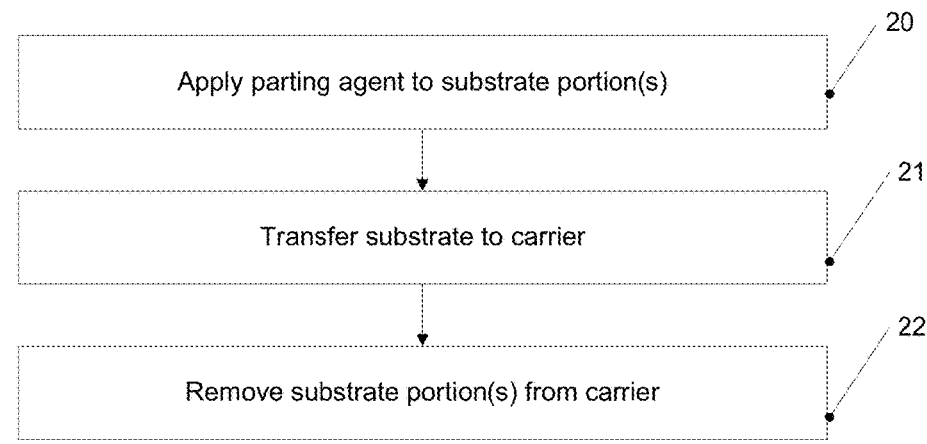
FIG. 2 is a flowchart illustrating a method according to an embodiment.

In FIG. 2, a flowchart illustrating a method according to an embodiment is shown. While certain acts or events are described with reference to FIG. 2, it should be noted that additional acts or events for treating a substrate may take place prior to, after and/or between the acts or events described with reference to FIG. 2. The method of FIG. 2 may be implemented using the apparatus of FIG. 1, but may also be implemented using other apparatuses.

At 20, a parting agent is applied to one or more portions of a substrate, for example, to portions of a semiconductor wafer. The semiconductor wafer may, for example, be a diced wafer on a grinding tape. The parting agent may for example comprise fluorosilicone or a fluoropolymer as described above, but is not limited thereto.

At 21, the substrate is transferred to a carrier, for example an adhesive tape or another kind of carrier provided with an adhesive. In embodiments, the substrate is transferred to the carrier such that the parting agent is interposed between substrate and carrier.

At 22, one or more substrate portions to which the parting agent has been applied at 20 are removed from the carrier. Removing the one or more substrate portions from the carrier may include an activation of the parting agent, for example, using ultraviolet radiation. In some embodiments, a peripheral portion, for example, a ring-shaped portion, of the substrate may be removed from the carrier.

To further illustrate the embodiments of FIGS. 1 and 2, FIGS. 3A to 3C show an implementation example in various stages of processing. The implementation example of FIGS. 3A to 3C serves illustrative purposes only and is not to be construed as limiting, but serves only to provide a more thorough understanding of some of the features, acts or events described above with reference to FIGS. 1 and 2 using a non-limiting example.

Figure 3A:
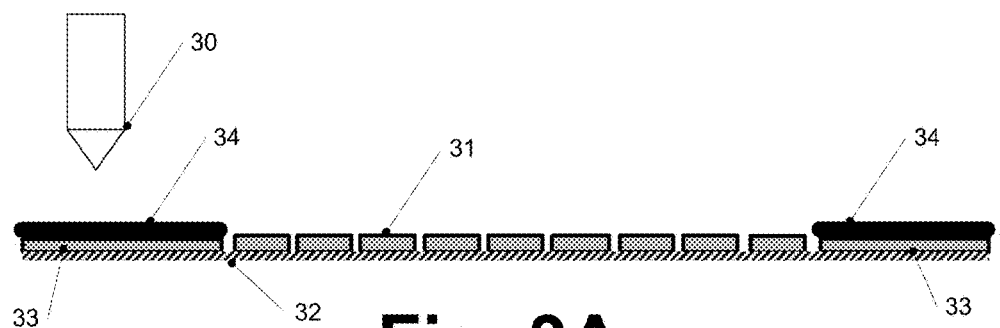
FIGS. 3A to 3C are diagrams for illustrating various elements and processing stages of various embodiments.
Figure 3B:
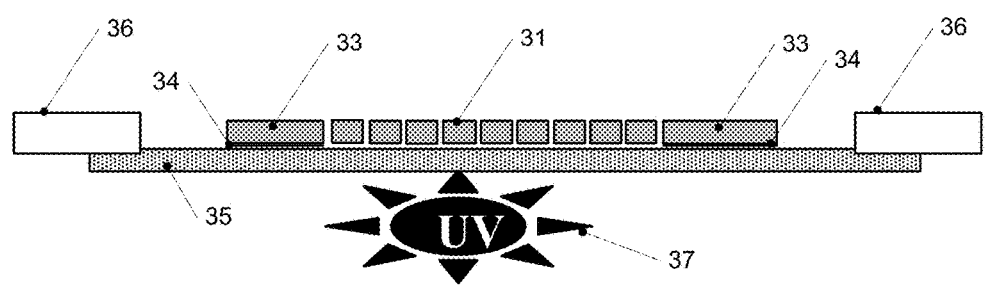
Figure 3C:
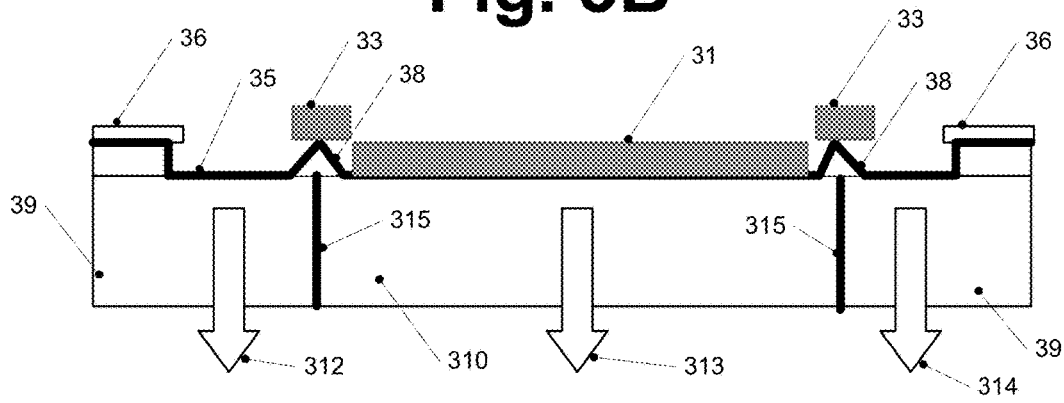

In FIG. 3A, a substrate 31, in this case a diced semiconductor wafer, i.e., a semiconductor wafer diced into a plurality of separate portions such as dies or chips, is provided on a grinding tape 32. Note that FIGS. 3A to 3C show cross-sectional views, and semiconductor substrates usually have a generally circular shape with a flat on one side. However, other substrate shapes may also be used. Substrate 31 has a peripheral ring-shaped portion 33. For example, in the stage shown in FIG. 3A, substrate 31 may just have been grinded and/or etched to be thinned. Ring-shaped peripheral portion 33 is an example for a portion of the substrate which is later to be removed from a carrier. Therefore, as shown in FIG. 3A a parting agent 34 is applied to an upper side (side facing away from grinding tape 32) of ring-shaped peripheral portion 33 using an applicator 30, for example, an applicator where parting agent 34 is applied to ring-shaped peripheral portion 33 using a nozzle. Other techniques for applying parting agent 34 may be used as well, as explained above.

In FIG. 3B, substrate 31 together with its ring-shaped peripheral portion 33 have been transferred from grinding tape 32 to a carrier 35, for example, a dicing tape, provided between handling portions 36. Substrate 31 is transferred to dicing tape 35 such that parting agent 34 is interposed between the ring-shaped peripheral portions 33 and dicing tape 35. Parting agent 34 may, for example, comprise a fluoropolymer or a fluorosilicone or any other suitable parting agent. Furthermore, in FIG. 3B a UV light source 37 is schematically shown which may then activate parting agent 34 to facilitate removal of ring-shaped peripheral portion 35 from dicing tape 35. This removal is then shown in FIG. 3C.

In FIG. 3C, substrate 31 together with dicing tape 35 is provided on blocks 39 and 310. Block 39 extends in a ring-shaped manner around block 310.

Block 310 is separated from block 39 by a cut line 315. AS indicated by arrows 312, 313 and 314, after removal of ring-shaped peripheral portion 33 facilitated by parting agent 34 at locations 38, substrate 31 which may, for example, comprise semiconductor devices to be shipped to a customer remains on block 310, whereas remaining portions (which do not pertain to the final product) remain on block 39. By use of the parting agent, removal of ring-shaped peripheral portion 33 in some embodiments is facilitated compared to conventional solutions which do not use a parting agent.

While in the example of FIGS. 3A to 3C, parting agent 34 has been applied to a ring-shaped peripheral portion 33, in other embodiments a parting agent may be applied additionally or alternatively to one or more other substrate portions to facilitate removal thereof in some state of processing.

What is claimed is:

1. A method comprising:
    providing a diced semiconductor substrate;
    applying a parting agent to at least one portion of the diced semiconductor substrate;
    transferring the diced semiconductor substrate to a carrier; and
    removing the at least one portion of the diced semiconductor substrate from the carrier.

2. The method of claim 1, wherein transferring the diced semiconductor substrate to the carrier comprises transferring the diced semiconductor substrate to the carrier such that the parting agent is interposed between the at least one portion of the diced semiconductor substrate and the carrier.

3. The method of claim 1, wherein the parting agent comprises a fluoropolymer.

4. The method of claim 1, wherein the parting agent comprises fluorosilicone.

5. The method of claim 1, wherein the diced semiconductor substrate comprises a diced semiconductor wafer.

6. The method of claim 1, wherein the carrier comprises a tape.

7. The method of claim 6, wherein the tape comprises a dicing tape.

8. The method of claim 1, wherein the at least one portion of the diced semiconductor substrate comprises a peripheral portion of the diced semiconductor substrate.

9. The method of claim 1, wherein removing the at least one portion of the diced semiconductor substrate comprises irradiating the diced semiconductor substrate with ultraviolet light.

10. A method comprising:
    providing a diced semiconductor substrate on a first carrier;
    applying a parting agent to a peripheral portion of the diced semiconductor substrate on a side facing away from the first carrier;
    transferring the diced semiconductor substrate from the first carrier to a second carrier such that the parting agent is interposed between the peripheral portion of the diced semiconductor substrate and the second carrier; and
    removing the peripheral portion of the diced semiconductor substrate from the second carrier.

11. The method of claim 10, wherein the first carrier comprises a grinding tape.

12. The method of claim 10, wherein the second carrier comprises a dicing tape.

13. The method of claim 10, wherein the parting agent comprises a fluoropolymer.

14. The method of claim 10, wherein the parting agent comprises a fluorosilicone.

* * * * *